United States Patent
Green et al.

(10) Patent No.: US 9,276,101 B2
(45) Date of Patent: Mar. 1, 2016

(54) HIGH SPEED GALLIUM NITRIDE TRANSISTOR DEVICES

(71) Applicant: Freescale Semiconductor, Inc., Austin, TX (US)

(72) Inventors: Bruce M. Green, Gilbert, AZ (US); Karen E. Moore, Phoenix, AZ (US); Olin Hartin, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/752,066

(22) Filed: Jun. 26, 2015

(65) Prior Publication Data

US 2015/0295075 A1 Oct. 15, 2015

Related U.S. Application Data

(62) Division of application No. 13/453,127, filed on Apr. 23, 2012, now Pat. No. 9,099,433.

(51) Int. Cl.
*H01L 29/15* (2006.01)
*H01L 29/778* (2006.01)
*H01L 29/40* (2006.01)
(Continued)

(52) U.S. Cl.
CPC ........ *H01L 29/7787* (2013.01); *H01L 27/0629* (2013.01); *H01L 28/60* (2013.01); *H01L 29/2003* (2013.01); *H01L 29/402* (2013.01); *H01L 29/404* (2013.01);
(Continued)

(58) Field of Classification Search
CPC ...................... H01L 29/2003; H01L 29/66462; H01L 29/7787; H01L 29/42316; H01L 29/7786; H01L 29/42372; H01L 29/4238; H01L 29/42364; H01L 29/0692; H01L 29/42376; H01L 29/0657; H01L 29/407; H01L 27/0629; H01L 21/0254; H01L 21/28587; H01L 21/28264; H01L 21/28593; H01L 23/3171; H01L 28/86
USPC .................. 257/192, 194, E21.407, E27.012, 257/E29.253, E29.246, E29.252, E21.403, 257/E29.127, E21.409, E29.315, 472, 76, 257/E21.186, E21.45, E29.241, E29.249, 257/E29.255, 187, 189, 637, 65, 745; 438/285, 172, 167, 476, 590
See application file for complete search history.

(56) References Cited

U.S. PATENT DOCUMENTS 4,700,462 A 10/1987 Beaubien et al.
5,053,348 A 10/1991 Mishra et al.
(Continued)

OTHER PUBLICATIONS

D. S. Lee et al., 300-GHz InAlN/GaN HEMTs With InHGaN Back Barrier, IEEE Electron Device Letters, vol. 32, No. 11, Nov. 2011.
(Continued)

*Primary Examiner* — Julio J Maldonado
*Assistant Examiner* — Cory Eskridge
(74) *Attorney, Agent, or Firm* — Terrile, Cannatti, Chambers & Holland, LLP; Michael Rocco Cannatti

(57) ABSTRACT

A low leakage current switch device (110) is provided which includes a GaN-on-Si substrate (11-43) covered by a passivation surface layer (43) in which a T-gate electrode with sidewall extensions (48) is formed and coated with a conformal passivation layer (49) so that the T-gate electrode sidewall extensions are spaced apart from the underlying passivation surface layer (43) by the conformal passivation layer (49).

20 Claims, 9 Drawing Sheets

(51) Int. Cl.
  *H01L 29/423* (2006.01)
  *H01L 29/66* (2006.01)
  *H01L 29/20* (2006.01)
  *H01L 27/06* (2006.01)
  *H01L 49/02* (2006.01)
  *H01L 29/47* (2006.01)

(52) U.S. Cl.
  CPC ... *H01L 29/42316* (2013.01); *H01L 29/42376* (2013.01); *H01L 29/475* (2013.01); *H01L 29/66462* (2013.01)

(56) References Cited

U.S. PATENT DOCUMENTS

| | | | |
|---|---|---|---|
| 5,484,740 | A | 1/1996 | Cho |
| 6,274,893 | B1 | 8/2001 | Igarashi et al. |
| 7,135,416 | B2 | 11/2006 | Totsuka et al. |
| 7,750,370 | B2 | 7/2010 | Smorchkova et al. |
| 7,879,446 | B2 | 2/2011 | Liu et al. |
| 7,935,620 | B2 | 5/2011 | Green et al. |
| 2004/0224529 | A1 | 11/2004 | Totsuka et al. |
| 2009/0146191 | A1 | 6/2009 | Green et al. |
| 2009/0159930 | A1 | 6/2009 | Smorchkova et al. |
| 2009/0230430 | A1* | 9/2009 | Miyamoto ............ H01L 29/404 257/192 |
| 2011/0156051 | A1 | 6/2011 | Green et al. |
| 2012/0042941 | A1 | 2/2012 | Seguin et al. |

OTHER PUBLICATIONS

T. Ohki et al., Reliability o GaN HEMTs: Current Status and Future Technology, IEEE 47th Annual International Reliability Physics Symposium, Montreal 2009.

T. Palacios et al., High-Power AlGaN/GaN HEMTs for Ka-Band Applications, IEEE Electron Device Letters, vol. 26, No. 11, Nov. 2005.

B.M. Green, Characteristics, Optimization, and Integrated Circuit Applications of Aluminum Gallium Nitride/Gallium Nitride High Electron Mobility Transistors, Aug. 2001.

Ritala M. et al., Perfectly Conformal TiN and Al2O3 Films Deposited by Atomic Layer Deposition. Chem. Vap. Deposition, 5:7-9. doi: 10.1002/(SICI)1521-3862(199901)5:1<7::AIDCVDE7>3.0.00;2-J, 1999.

* cited by examiner

HIGH SPEED GALLIUM NITRIDE TRANSISTOR DEVICES

CROSS-REFERENCE TO RELATED APPLICATIONS

This application is a divisional of co-pending application Ser. No. 13/453,127, filed Apr. 23, 2012, which is incorporated herein by reference in its entirety.

BACKGROUND OF THE INVENTION

1. Field of the Invention

The present invention is directed in general to integrated circuit devices and methods for manufacturing same. In one aspect, the present invention relates to the manufacture and use of gallium nitride transistor devices.

2. Description of the Related Art

Semiconductor devices used in high-efficiency power amplifier (HEA) applications require higher speed and power handling capability. To meet these operating requirements, high power semiconductor devices may be formed with semiconductor materials, such as gallium nitride (GaN) having material properties that are suitable for use in such applications. For example, high speed transistor switch devices, such as high electron mobility transistor (HEMT) devices, formed with GaN-based materials offer many advantages in RF applications, especially in HEA applications, by delivering high current, high breakdown voltage, and high unity gate current cutoff frequency ($f_T$). However, as the speed of the devices is increased by shrinking the gate length and increasing the electron concentration in the device channel, gate and drain leakage currents can increase and device breakdown voltage can be reduced. Attempts to reduce gate leakage current in such devices may adversely affect other device properties. For example, device features and processing steps used to reduce leakage current can degrade the $f_T$ of the device by adding gate capacitance.

BRIEF DESCRIPTION OF THE DRAWINGS

The present invention may be understood, and its numerous objects, features and advantages obtained, when the following detailed description is considered in conjunction with the following drawings, in which.

Figure 1:
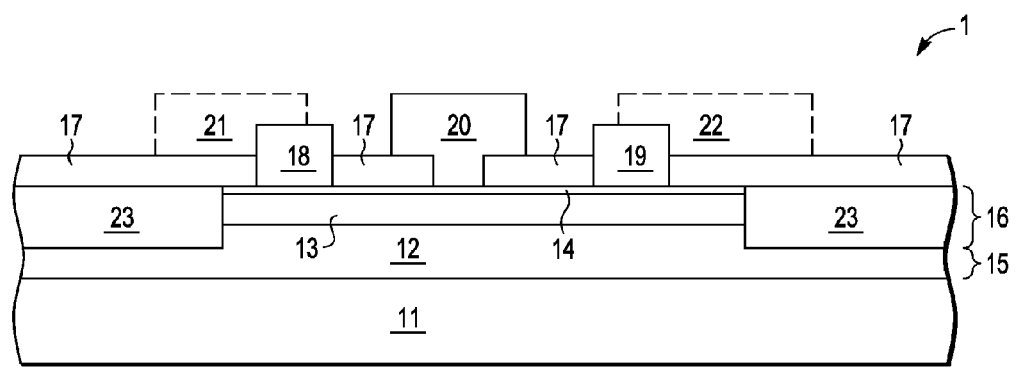
FIG. 1 is a simplified partial cross-sectional view of a field effect transistor employing a Schottky gate contact with sidewall extensions formed on an underlying dielectric passivation layer.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high frequency, high voltage gallium nitride field effect transistor device and associated fabrication process are described for providing high unity current gain cut-off frequency ($f_T$) and high maximum frequency of oscillation ($f_{max}$) with very low off-state gate and drain leakage currents by covering a gallium nitride substrate surface with a thin dielectric passivation layer e.g., 5-30 nm of LPCVD SiN) in which openings are etched to form gate and source/drain electrodes in ohmic contact with the gallium nitride substrate, where the gate electrode has sidewall extensions spaced apart from the thin dielectric passivation layer. During formation of the source/drain electrodes, a bottom capacitor plate may be formed with one or more patterned metal layers over an isolation region of the gallium nitride substrate. In selected embodiments, all or part of the sidewall surfaces of the gate electrode, source/drain electrodes, and bottom capacitor plate are coated by depositing one or more conformal dielectric layers (e.g., 100-1000 Å of $Al_2O_3$ and/or SiN formed by atomic layer deposition). At the gate electrode, the conformal dielectric layer(s) form a vertical metal-insulator-semiconductor (MIS) sandwich along the vertical edges of the electrode base or bottom portion that reduces leakage and ensures high-voltage operation. In other embodiments, a top capacitor plate may be formed after depositing the conformal dielectric layer to form a MUM capacitor that is separated from the bottom capacitor plate by the conformal dielectric layer.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art In addition, although specific example materials are described herein, those skilled in the art will recognize that other materials with similar properties can be substituted without loss of function. It is also noted that, throughout this detailed description, certain materials will be deposited, grown, etched, masked and/or removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Applicants have determined that a need exists for improved semiconductor devices and associated fabrication processes to overcome the problems in the art, such as outlined above, though further limitations and disadvantages of conventional processes and technologies will become apparent to one of skill in the art after reviewing the remainder of the present application. For example, transistors formed with AlGaN/GaN hetero-structures enjoy high speed, high breakdown and low on-resistance because GaN has inherently high breakdown field strength and AlGaN/GaN hetero-junctions have very high electron sheet density. The high breakdown field strength and high electron sheet density arise from the relatively wide band of GaN (3.4 eV) as compared to conventional semiconductor technologies such as Si (1 eV bandgap) and GaAs (1.6 eV bandgap). To illustrate an example GaN hetero-structure transistor device for simultaneously providing high breakdown voltage and high frequency capability, reference is now made to FIG. 1 which depicts a simplified partial cross-sectional view of a hetero-junction field effect transistor (HFET) device 1 showing the arrangement of various device regions. As depicted, the HFET device 1 is formed in a semiconductor substrate 11-14 which includes a host or base substrate layer 11 formed with an insulating layer, such as sapphire, Si, SiC, diamond, GaN, AlN and various other generally refractory materials. On the host/base substrate layer 11, a gallium nitride (GaN) buffer layer 12, undoped $Al_xGa_{1-x}N$ barrier layer 13, and thin GaN cap or surface termination layer 14 are sequentially formed using a desired process, such as metal-organic chemical vapor deposition (MOCVD), molecular beam epitaxy (MBE), hydride vapor phase epitaxy (HATE) or a combination thereof. In an active island or mesa section 16 of the semiconductor substrate 11-14, an active island or mesa 16 is formed to extend from a lower portion 15 of the GaN buffer layer 12, where the electrically inactive insulating material in isolation regions 23 outside the mesa or island 16 provides device-to-device isolation and the lower portion 16 provides a transition zone for any crystalline imperfections at the interface with the host/base substrate 11. Over the semiconductor substrate, a passivation layer 17 is formed with a dielectric material (e.g., $Si_3N_4$, $SiO_2$, $SiO_xN_y$, AlN, $Al_2O_3$, $HfO_2$). The passivation layer 17 is formed with openings for various electrodes 18-20 for the HFET device 1. In particular, the source/drain electrodes 18-19 make contact through openings in the passivation layer 17 to connect source/drain regions (not shown) in the substrate to the conductive interconnections 21-22 for electrical coupling to various other devices or elements (not shown). In addition, the mushroom or T-gate electrode 20 is formed in a gate opening of the passivation layer 17 with a short gate length contact base at the substrate surface with sidewall extensions formed directly on and adjacent to the underlying dielectric passivation layer 17. Though not shown, it will be appreciated that one or more previously formed gate dielectric layers may be exposed by the gate opening which were previously formed on the active device island or mesa in the intended channel regions using any desired deposition sequence, though the gate dielectric layer(s) are not necessarily formed on the active device islands(s) or mesa(s). However, by forming the gate electrode sidewall extensions directly on the dielectric passivation layer, additional capacitance is added to the HFET device 1, thereby impairing the device unity current gain cutoff frequency ($f_T$). In addition, metal materials used to form the gate electrode 20 can react adversely with a SiN passivation layer 17, thereby increasing leakage current.

Figure 2:
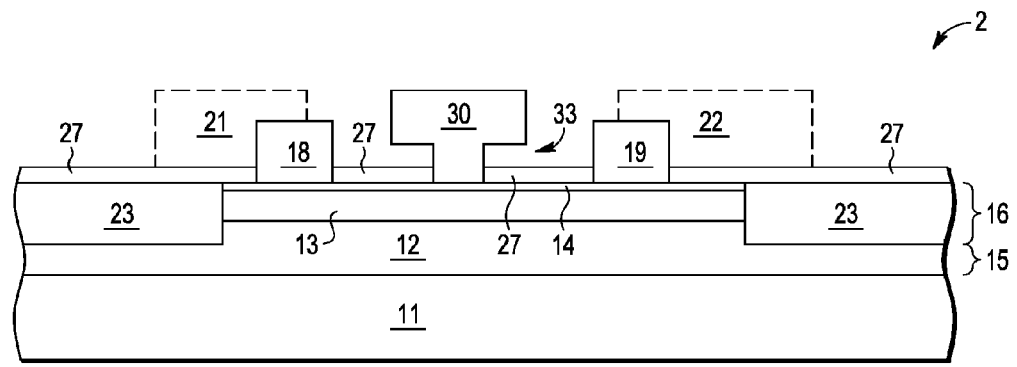
FIG. 2 is a simplified partial cross-sectional view of a field effect transistor employing a Schottky gate contact with sidewall extensions formed to be spaced apart from an underlying dielectric passivation layer.

To alleviate the problem of additional capacitance created by the gate electrode sidewall extensions, the sidewall extensions may be raised or moved away from the underlying passivation layer. An example is illustrated in FIG. 2 which depicts a simplified partial cross-sectional view of a heterojunction field effect transistor (HFET) device 2 having a semiconductor substrate 11-14 with a passivation surface layer 27 in which source/drain electrodes 18-19 and a raised T-shaped gate electrode 30 are formed. As depicted, the HFET device 2 and associated fabrication sequence is similar to the HFET device 1 shown in FIG. 1, except that the sidewall extensions of the gate electrode 30 are formed to be spaced apart from the underlying dielectric passivation layer 27. This spacing may be achieved by using a patterned multi-layer resist to form the raised T-shaped gate electrode 30 so that there is a vertical gap or space 33 which reduces the capacitance between the gate and source and gate and drain. Unfortunately, the depicted HFET device 2 will have higher gate leakage and poor pulsed current-voltage performance because the vertical gate gap 33 actually increases fields in the channel region at the drain edge of the gate.

Figure 3:
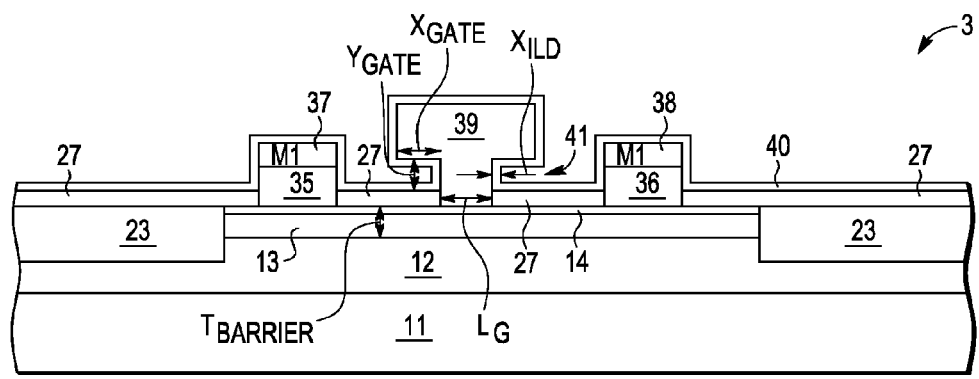
FIG. 3 is a simplified partial cross-sectional view of a field effect transistor employing a Schottky gate contact with sidewall extensions formed to be spaced apart from an underlying dielectric passivation layer and conformally coated with a dielectric layer.

To alleviate the gate leakage problem created by the raised gate electrode sidewall extensions, the electrode base and sidewall extensions may be covered or coated with one or more conformal dielectric layers, thereby creating a minimal MIS sandwich at the vertical edges of the gate electrode base that reduces leakage and ensures good high-voltage operation. An example is illustrated in FIG. 3 which depicts a simplified partial cross-sectional view of a heterojunction field effect transistor (HFET) device 3 having a semiconductor substrate 11-14 with a passivation surface layer 27 in which source/drain electrodes 35-38 and a raised T-shaped gate electrode 39 are formed and conformally coated with a dielectric layer 40. As depicted, the HFET device 3 and associated fabrication sequence is similar to the HFET device 2 shown in FIG. 2, except that the exposed sidewalls of the electrodes 35-39 are conformally coated with a dielectric layer 40. The dielectric layer 40 may be formed by using atomic layer deposition (ALD) or other suitable deposition techniques to form a dielectric layer with a suitable dielectric material $Al_2O_3$ or SiN) to a predetermined thickness (e.g., 100-500 Å). As illustrated, the conformal dielectric layer 40 is formed over the passivation surface layer 27 and on the exposed sidewalls of the raised T-shaped gate electrode 39, but the short gate length contact base of the gate electrode 39 and passivation surface layer 27 are still in contact with one another. The resulting structure establishes a MIS sandwich 41 in the gap or overlap region below the gate electrode sidewalk extensions, where the MIS sandwich 41 includes a top metal (M) layer (formed from the extensions of the T-shaped gate electrode 39), a middle insulator (I) layer (formed from the dielectric layer 40 and passivation surface layer 27 along the vertical edges of the base of the gate electrode 39), and a bottom semiconductor (S) layer (formed from the semiconductor substrate layer(s) 12-14). The small MIS structure 41 in the vertical direction provides a field modulating region which helps achieve low leakage current while only slightly increasing the gate capacitance. In selected embodiments, the MIS structure 41 on either side of the gate is controlled to increase the gate capacitance (sum of gate-source and gate-drain capacitance) by no more than 20%, and preferably no more than 10%, by limiting the amount of insulating material on the sidewall of the gate's base region according to the gate channel length $L_G$, the vertical gap distance $Y_{GATE}$ (separating the lower edge of the gate sidewall extensions and the passivation surface 27), the length of the gate sidewall extensions $X_{GATE}$, and the barrier thickness $T_{BARRIER}$. In an example embodiment, $Y_{GATE}$ should be approximately 500-5000 Å in combination with a thickness $X_{ILD}$ of the sidewall dielectric layer 41 of at least 50 Å, preferably at least 200 Å. To achieve this, the thickness $X_{ILD}$ of the sidewall dielectric layer 41 may be set so that its thickness in combination with the gap $Y_{GATE}$ and $X_{GATE}$ are selected together so that the gate capacitance will not be increased by more than 5-20%, where the gate capacitance increase allowed depends on the specific device application. As will be appreciated, the device dimensions $Y_{GATE}$ and $X_{ILD}$ are set depending on the gate length. $L_G$, and the barrier thickness $T_{BARRIER}$. The dimension $X_{GATE}$ is set by the requirement that the DC gate resistance should be less than 120 ohms/mm to achieve suitably low gate resistance. For most applications, $X_{GATE}$ will range between 500 and 3000 Å. Fixing $X_{GATE}$ and the thickness of the passivation surface layer 27, the gate design parameters may be set so as to increase the gate capacitance by no more than a factor F using the relation, $$\frac{(Y_{GATE} - 2X_{ILD})}{(\varepsilon_{ILD} - 1)X_{ILD} + X_{GATE}} + 2\frac{X_{ILD}}{\varepsilon_{ILD} Y_{GATE}} > 2\frac{T_{BARRIER}}{F\varepsilon_{BARRIER} L_G}$$

where and $\in_{ILD}$ and $\in_{BARRIER}$ refer to the average relative dielectric constants of the dielectric layer 40 and the barrier layer 52 and cap layer 53. Using the above calculation allows the designer to determine the maximum thickness of the dielectric layer 40 for a given amount of capacitance increase, F. For a gate length $L_G$=1 μm, a gap value $Y_{GATE}$=2000 Å, and a passivation surface layer thickness of 100 Å, the maximum sidewall dielectric layer thickness $X_{ILD}$ should be less than 440 Å to achieve a capacitance increase of no more than 10% and resultant $f_T$ of approximately 91 GHz. A device designer may use this or other combination of device designs as illustrated in the table below where the parasitic capacitance (the amount of capacitance increase) due to the presence of the dielectric layer 40 is held to 10% of the total gate capacitance to design devices with $f_T$ values that range from approximately 45 to 180 GHz depending on the design parameters used. As seen from the table, depending on the values of $L_G$ and $T_{BARRIER}$ chosen, it may be advantageous to select the value of $Y_{GATE}$ so that thicker values of $X_{ILD}$ may be used to ensure good reproducibility. Similar tables may be calculated using other values of $L_G$, $Y_{GATE}$, $X_{GATE}$, and $T_{BARRIER}$ to determine the device design parameters needed to achieve $f_T$'s above or below the $f_T$'s stated here,

| Gate Length (μm) | $Y_{GATE}$ (Å) | $T_{BARRIER}$ (Å) | Maximum $X_{ILD}$ ($Al_2O_3$) Thickness (Å) | Total Gate Capacitance (pF/mm) | Capacitance Increase (pF/mm) | $f_T$ (GHz) |
|---|---|---|---|---|---|---|
| 0.05 | 2000 | 100 | 120 | 0.40 | 0.04 | 181 |
| 0.1 | 1000 | 100 | 90 | 0.80 | 0.08 | 91 |

-continued

| Gate Length (μm) | $Y_{GATE}$ (Å) | $T_{BARRIER}$ (Å) | Maximum $X_{ILD}$ (Al$_2$O$_3$) Thickness (Å) | Total Gate Capacitance (pF/mm) | Capacitance Increase (pF/mm) | $f_T$ (GHz) |
|---|---|---|---|---|---|---|
| 0.1 | 2000 | 100 | 440 | 0.80 | 0.08 | 91 |
| 0.1 | 2000 | 200 | 120 | 0.40 | 0.04 | 90 |
| 0.15 | 1000 | 100 | 190 | 1.19 | 0.12 | 61 |
| 0.15 | 1000 | 110 | 160 | 1.10 | 0.11 | 60 |
| 0.15 | 1000 | 200 | 50 | 0.60 | 0.06 | 60 |
| 0.15 | 2000 | 100 | 750 | 1.19 | 0.12 | 61 |
| 0.15 | 2000 | 110 | 660 | 1.09 | 0.11 | 60 |
| 0.15 | 2000 | 200 | 280 | 0.60 | 0.06 | 60 |
| 0.2 | 1000 | 100 | 280 | 1.59 | 0.16 | 46 |
| 0.2 | 1000 | 200 | 90 | 0.80 | 0.08 | 45 |
| 0.2 | 2000 | 100 | 1060 | 1.59 | 0.16 | 46 |
| 0.2 | 2000 | 200 | 440 | 0.80 | 0.08 | 45 |

It should be appreciated that the designs and analyses presented assume that the gate 39 is symmetrical (i.e., gate sidewall extensions on either side of the gate are the same length). Other embodiments may include gates with sidewall extensions of different lengths on the gate and drain sides of the gate (e.g. "gamma gates") that may be used to meet device specifications for certain applications where it is desired to reduce gate-source or gate drain capacitance while increasing the corresponding gate-drain or gate source capacitance, all the while maintaining low DC gate metal resistance. The principles discussed previously still apply and may be adapted by a device designer with ordinary skill by separately treating the contribution of dielectrics to the gate-source and gate-drain capacitances.

Figure 4:
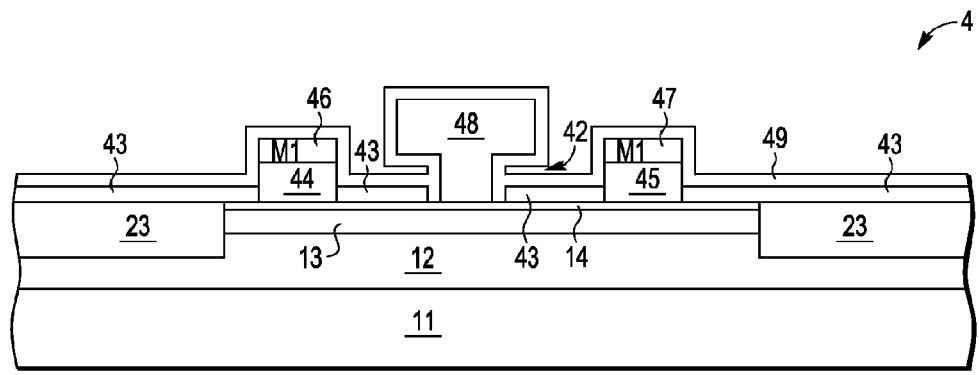
FIG. 4 is a simplified partial cross-sectional view of a field effect transistor employing a Schottky gate contact with sidewall extensions formed to be spaced apart from an underlying dielectric passivation layer and conformally coated with a dielectric layer to separate the Schottky gate contact from the dielectric passivation layer.

Unfortunately, gate leakage in the depicted HFET device 3 may be exacerbated if the metal used to form the short gate length contact base of the gate electrode 39 reacts adversely with the SiN dielectric material used to form the passivation surface layer 27. To prevent adverse reaction between the electrode and passivation surface layer materials, the electrodes and the passivation surface layer are separated by a lateral gap or space which is filled with non-reactive dielectric materials, thereby creating a reliable MIS sandwich at the gate electrode that reduces leakage and ensures good high-voltage operation. An example is illustrated in FIG. 4 which depicts a simplified partial cross-sectional view of a heterojunction field effect transistor (HFET) device 4 having a semiconductor substrate 11-14 with a passivation surface layer 43 in which source/drain electrodes 44-47 and a raised T-shaped gate electrode 48 are formed and conformally coated with a dielectric layer 49. As depicted, the HFET device 4 and associated fabrication sequence is similar to the HFET device 3 shown in FIG. 3, except that the sidewalls of the electrodes 44-48 (including the lower sidewall regions adjacent to the substrate) are coated with the dielectric layer 49, thereby separating the electrodes from the electrodes 44-48 from the dielectric passivation surface layer 43. To achieve this separation, expanded openings are formed in the passivation surface layer 43, followed by formation of smaller electrodes 44-48 wholly within the expanded openings so that there are separation gaps between the electrodes 44-48 and the passivation surface layer 43. These separate gaps may be filled with the dielectric coating layer 49. The resulting structure establishes a MIS sandwich 42 in the gap or overlap region below the gate electrode sidewall extensions where the SiN passivation surface layer 43 does not touch the gate electrode material (e.g., Nickel) in field modulating region, thereby preventing Ni—Si formation for improved reliability. The design considerations for the design of the gate and the thickness of the dielectric layer 49 to achieve operation with minimal impact on frequency performance directly apply from those discussed in connection with FIG. 3.

As will be appreciated, a variety of different fabrication processes can be used to manufacture the field effect transistor devices described herein. For example, FIGS. 5-14 are simplified cross-sectional views at different stages of manufacture which result in a field effect transistor device that is similar to the HFET device 3 shown in FIG. 3. In these figures, like reference numbers are used to identify like regions in the device.

Figure 5:
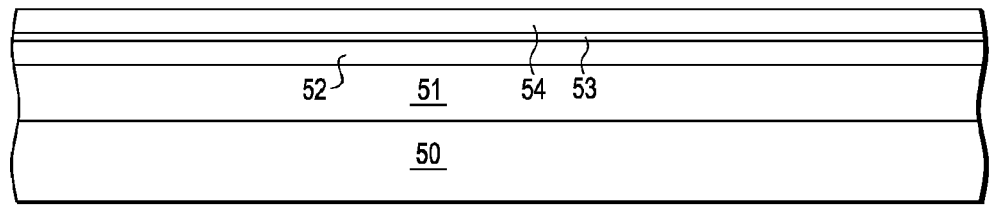
FIG. 5 is a simplified partial cross-sectional view of a semiconductor structure having a substrate with an epitaxial gallium nitride layer and a passivation surface layer.

At an initial manufacturing stage shown in the simplified partial cross-sectional view in FIG. 5 which depicts a wafer structure having a substrate with an epitaxial gallium nitride layer and a passivation surface layer. In an example embodiment, the wafer structure includes a host or base substrate layer 50. Depending on the type of transistor device being fabricated, the substrate layer 50 may be implemented as a bulk semiconductor substrate, an insulator substrate, a bulk metal substrate, a single crystalline silicon (doped or undoped) substrate, a poly-silicon substrate or other polycrystalline semiconductor substrate such as polycrystalline SiC, a semiconductor-on-insulator (SOI) substrate, a single or multi-layered composite film wafer substrate or any material including, for example, Si, SiC, SiGe, SiGeC, Ge, GaAs, InAs, InP, sapphire, diamond, GaN, or AlN, as well as other Group III-IV compound semiconductors or any combination thereof. With high frequency applications, the substrate should have at least moderate thermal conductivity ($\kappa > 2$ W/cm-K) and have high electrical resistivity ($\rho > 10^4$ ohm-cm) or preferably semi-insulating ($\rho > 10^6$ ohm-cm) or even insulating ($\rho > 10^{12}$ ohm-cm) properties. For these reasons, SiC ($\kappa = 4$ W/cm-K, $\rho = 10^6$-$10^{11}$ ohm-cm) is the preferred choice, although for certain specific applications other substrates as discussed above may be used.

The wafer structure also includes an epitaxial substrate layer 51 formed (e.g., grown or deposited) on or over the substrate 50 to a predetermined thickness. The epitaxial substrate layer 51 may be implemented with gallium nitride (GaN) and/or aluminum nitride (AlN), or any alloys such as aluminum gallium nitride (AlGaN), indium gallium nitride (InGaN), and aluminum indium gallium nitride (AlInGaN). These materials are semiconductor compounds with strong chemical bonds that produce a wide, direct bandgap that provides a high breakdown field strength. Group nitrides and their associated heterostructures (such as AlGaN/GaN, InAlN/GaN, InGaN/GaN, etc.) have a number of attractive properties including high electron mobility, high breakdown field strength, high electron sheet density, and others. Accordingly, group-III nitride materials are being widely investigated in many microelectronic applications such as transistors and optoelectronic devices. In selected embodiments, the substrate layer 51 may be formed with an epitaxial growth process that is seeded from a seed or nucleation layer (not shown) on the substrate 50 so that a single crystal epi substrate layer 51 is formed. In selected embodiments, the epitaxial substrate layer 51 is formed on surface of substrate 50 by, for example, Metal-Organo Chemical Vapor Deposition (MOCVD) or Molecular Beam Epitaxy (MBE), with MOCVD being preferred for GaN. As described herein and understood by those skilled in the art, the process of forming an epitaxial layer may be described as either depositing or growing a layer so that the "growth" and "deposition" terms are used interchangeably in this respect. As formed, the predetermined thickness of the epitaxial substrate layer 51 may be in the range of approximately 0.05 to 20 micrometers, preferably about 0.3 to 2 micrometers, but thicker and thinner layers may also be used.

The wafer structure may also include an additional undoped $Al_xGa_{1-x}N$ barrier layer 52 formed on the epitaxial substrate layer 51 using any desired technique (e.g., MOCVD, MBE, HYPE, or the like) to a predetermined thickness (e.g., approximately 50-400 Å, preferably about 50-250 Å) to form a hetero-junction. In addition, the wafer structure surface may be covered or terminated with GaN cap or surface termination layer 53 formed on the barrier layer 52 using any desired technique (e.g., MOCVD, MBE, HVPE, or the like) to a predetermined thickness ('e.g., approximately 5-80 Å).

On the wafer structure, a first passivation layer 54 is formed with any desired insulating or dielectric material, such as $Si_3N_4$ (silicon nitride), $SiO_2$, $SiO_xN_y$, AlN, $Al_2O_3$, and/or other suitable combinations or mixtures thereof. The first passivation layer 54 may be formed by depositing $Si_3N_4$ on the surface of the GaN cap or surface termination layer 53 by low-pressure chemical vapor deposition (LPCVD), plasma enhanced chemical vapor deposition (PECVD), physical vapor deposition (PVD), atomic layer deposition (ALD), evaporation, sputtering or other well-known techniques. In selected embodiments, the first passivation layer 54 is formed using LPCVD $Si_3N_4$ to a predetermined thicknesses (e.g., in the range of approximately 50 to 2000 Å, and more particularly about 50-150 Å), though other thicknesses and materials can be used. As will be appreciated, the choice of material for first passivation layer 54 will depend upon the choice of material for underlying substrate layers and may be selected to render the surface of the underlying substrate stable and having appropriate electrical properties (e.g., charged or neutral without significant surface states) during subsequent processing steps. In selected embodiments, the formation of the passivation layer 54 will reduce leakage current in the finally formed device by properly preparing the surface of the GaN layer 53 for deposition, and then depositing a silicon nitride film 42 having a low hydrogen content (e.g., <10%) to prevent a leakage current path from forming at the passivation film and underlying substrate.

Figure 6:
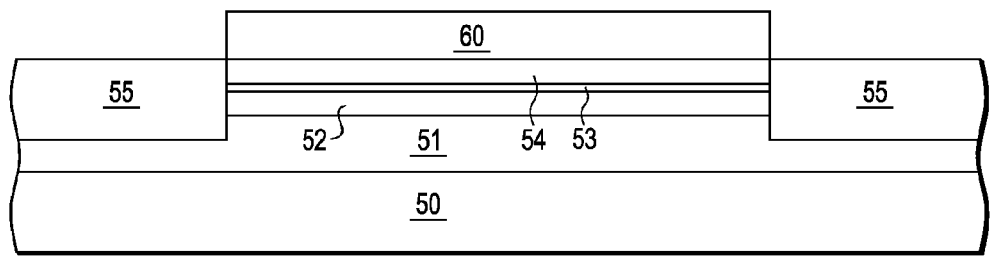
FIG. 6 illustrates processing of the semiconductor structure subsequent to FIG. 5 after isolation regions are formed in the substrate.

FIG. 6 illustrates processing of the semiconductor structure subsequent to FIG. 5 after isolation regions 55 are formed in the substrate 50-53 prior to ohmic contact formation. As illustrated, an implant mask 60 may be formed by depositing and patterning a layer of photoresist to define and expose the intended isolation regions 55 while covering and protecting the substrate 50-53 and passivation layer 54 in the active region area or "island." Alternatively, the implant mask 60 may be formed by depositing and selectively etching one or more mask layers silicon nitride or silicon dioxide) over the first passivation layer 54. Alternatively, the active channel layers 52, 53, and a portion of 51 may be etched away after etching dielectric layers 54 to form a "mesa" (not pictured). In this case, a second LPCVD SiN layer or other suitable dielectric (such as silicon dioxide, $Al_2O_3$, etc.) would be preferred to cover the etched regions (not pictured). However formed, the isolation regions 55 effectively define a mesa or island section for the active regions in the substrate 50-53. In selected embodiments, the isolation regions 55 may be formed by implanting any desired species of material into the exposed (unmasked) regions of the substrate 50-53 to generate defects (e.g., vacancies) and/or an amorphous crystal structure therein, including but not limited to implanting disruptive species (e.g., nitrogen ions, argon ions, helium ions, oxygen ions, or other inert implant species) at a predetermined implant energy and dopant concentration (e.g., at least approximately $10^{11}$ atoms/cm$^2$) so as to form isolation regions 55 in an upper portion of the exposed (unmasked) regions of the substrate 50-53 where the implanted ions are incorporated into the structure of the isolation regions 55. As formed, the isolation regions 55 electrically isolate the active region island to limit leakage current flow from outside the active region to conducting structures on the device mesa(s) or island(s) (e.g., gate and drain electrodes, contact pads of the source, drain and gate electrodes, and active regions of adjacent device(s) formed on the same substrate). As will be appreciated, the isolation regions 55 generally have an electrical isolation property with a sheet resistance of in the range of about $10^9$ ohms/☐ for implanted isolation regions and in the range of $10^6$ ohms/☐ for mesa isolated regions; mesa isolated regions' resistivity is limited by the resistivity of the GaN buffer that remains after mesa etching. When an implant process is used, the isolation regions 55 have a high vacancy concentration (e.g., greater than about $10^{18}$ to $10^{20}$ vacancies/cm$^3$) or crystalline defects which limits, or prevents, the transport of free carriers (e.g., electrons or holes) which contribute to the conductivity of the material. When a mesa isolation process is used, the removal of the active device channel leaves only the high resistivity buffer to conduct free carriers in the vicinity of the device. In the embodiments depicted hereafter, implant isolation is preferred, although in some situations, one may choose mesa etching or even a combination of mesa and implant isolation because of device requirements, the type of epitaxial wafer structure used, leakage requirements, equipment availability, cost, and other factors known to one with ordinary skill in the art.

Figure 7:
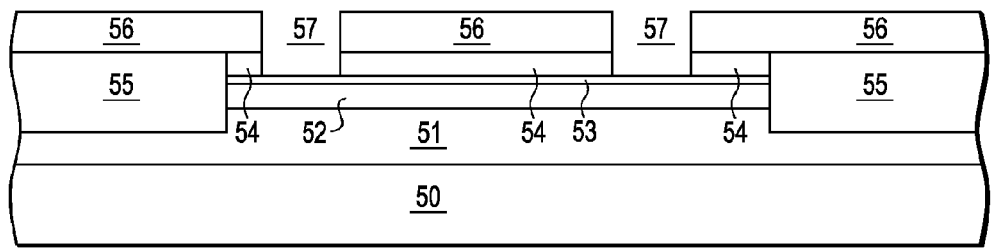
FIG. 7 illustrates processing of the semiconductor structure subsequent to FIG. 6 after contact openings are etched in a first mask layer to remove portions of the passivation surface layer and expose the substrate.

FIG. 7 illustrates processing of the semiconductor structure subsequent to FIG. 6 after source and drain contact openings 57 are formed with a selective etch mask 56 to remove portions of the passivation surface layer 54 and thereby expose the substrate 50-53. As a preliminary step, the isolation implant mask 60 is removed or stripped with an appropriate etch chemistry to leave the remnant passivation layer 54. Subsequently, a patterned etch mask 56 is formed, such as by depositing and patterning a layer of photoresist to define and expose openings 57 over the intended source/drain regions while otherwise protecting the substrate 50-53 and passivation layer 54 in the active region area. Depending on the number of type of layers formed in the passivation layer 54, one or more contact etch processes may be applied (such as reactive-ion etching, ion beam etching, plasma etching, laser etching, or the like) to form the source/drain contact openings 57 through the passivation surface layer 54 to expose the substrate surface at the intended source and drain regions. In selected embodiments, the source and drain contact openings 57 are formed by using a patterned photoresist or etch mask layer as a mask to etch a silicon nitride passivation surface layer 54 with a suitable selective etch chemistry.

Figure 8:
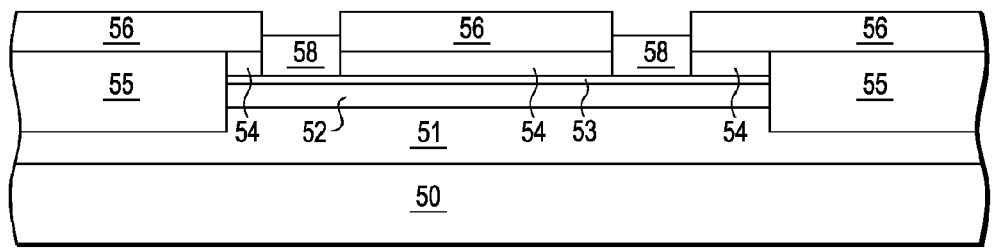
FIG. 8 illustrates processing of the semiconductor structure subsequent to FIG. 7 after one or more source/drain contact layers are formed in contact openings.

FIG. 8 illustrates processing of the semiconductor structure subsequent to FIG. 7 after one or more source/drain contact layers 58 are formed in contact openings 57. At this stage, the source and drain contacts 58 may be formed with any desired contact formation sequence, including but not limited to using a lift-off process which uses the same patterned photoresist or etch mask layer used to form source and drain contact openings 57. Alternatively, any desired metal deposition and masking and etching sequence may also be used to form the contacts 58 with one or more ohmic metal contact layers. When GaN is used for the surface termination layer 53, the ohmic contacts 58 may be formed as layered TiAlMoAu or TiAlNiAu layers formed by evaporation with the Ti layer in contact with the GaN surface termination layer 53, though other metal combinations and formation procedures can be used. Once formed, the ohmic contacts 58 may be annealed (e.g., at 850 C for 30 sec) as one or more alloy layers to provide ohmic contact to the channel using any desired anneal process, such as a furnace or rapid thermal anneal (RTA), where the anneal can be performed at this step or at any other step in the process preceding the formation of the isolation implant regions. If desired, the implant isolation regions 55 may instead be formed after the ohmic anneal step. As will be appreciated, the formation of ohmic contacts depicted in FIGS. 7-8 is provided for illustration purposes, and the ohmic contacts may instead be formed at a different stage of fabrication, such as prior to the formation of the isolation regions 55 as depicted in FIG. 6.

After forming the source/drain contacts 58, a mushroom or T-shaped gate electrode is patterned using multi-layer resist mask 59 in which a gate electrode opening 61 is formed to expose a gate contact surface of the substrate, and then filled with a gate metal. To illustrate this sequence, reference is now made to FIG. 9 which illustrates processing of the semiconductor structure subsequent to FIG. 8 after a gate electrode opening 61 is developed in a bi-layer or tri-layer resist mask 59 to expose portions of the passivation surface layer 54 and, after etching, to expose the substrate structure. The multi-layer resist mask 59 is formed by patterning an e-beam resist layer (e.g., polymethylmethacrylate) to define a mushroom or T-shaped opening 61. Depending on the number of type of layers formed in the multi-layer resist mask 59 and the desired shape of the opening 61, one or more e-beam resist developing processes may be applied (such as methyl isobutyl ketone and/or toluene) to form the mushroom or T-gate electrode opening 61. Suitable etch techniques such as inductively coupled plasma (ICP), electron-cyclotron resonance (ECR), or wet-etching are then used to etch through the passivation surface layer 54. In selected embodiments, the T-gate electrode opening 61 is used to mask dry etching through a silicon nitride passivation surface layer 54, though a wet etch chemistry may also be used to remove the silicon nitride passivation surface layer 54. Again, it will be appreciated that one or more gate dielectric layers may be exposed by the gate electrode opening which were previously formed on the active device island in the intended channel regions using any desired deposition sequence, though the gate dielectric layer(s) are not necessarily formed on the active device island(s). It is also appreciated that for some embodiments where an MISFET or MOSFET device is desired, the etch through surface passivation layer 54 may be reduced or omitted.

Figure 9:
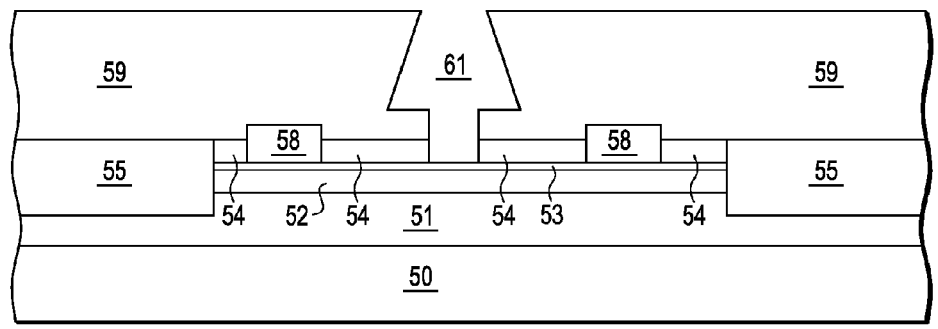
FIG. 9 illustrates processing of the semiconductor structure subsequent to FIG. 8 after a gate electrode opening is etched in a second mask layer to remove portions of the passivation surface layer.
Figure 10:
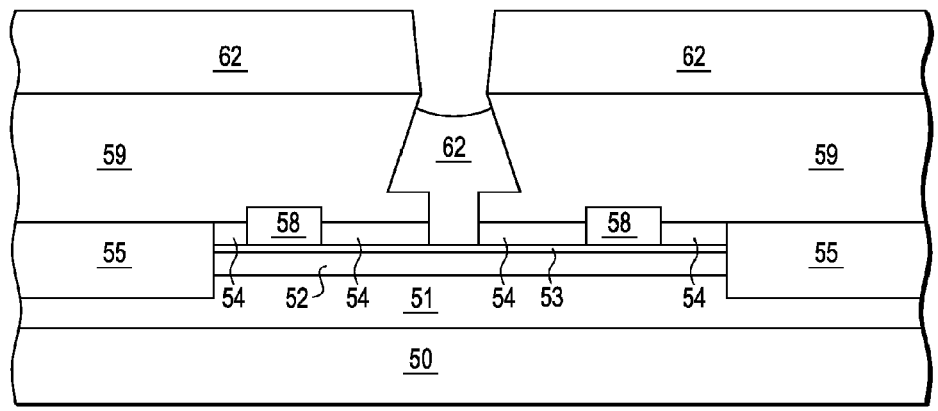
FIG. 10 illustrates processing of the semiconductor structure subsequent to FIG. 9 after a gate electrode is formed in the gate electrode opening.

FIG. 10 illustrates processing of the semiconductor structure subsequent to FIG. 9 after the gate metal layer is deposited to form the gate electrode 62 in the gate electrode opening. At this stage, the patterned gate electrode 62 may be formed after depositing one or more gate insulator layer or conductor layers (e.g., oxide, $Al_2O_3$, $HfO_2$ and/or metal layers) on the substrate structure 110 and at the bottom of the gate electrode opening 61, to form either HEMT, MESFET, MISFET or MOSFET devices. In selected embodiments, one or more initial gate Schottky contact layers (e.g., a Ni—Au or Pt—Au multi-layer) are formed or deposited in the gate electrode opening 61 to provide a suitable gate contact for an underlying epi GaN substrate layer 53 by depositing approximately 200 to 400 Angstroms of Ni, Pd, Ir, Re, Cu, or Pt in the gate electrode opening 61 to provide the desired gate contact. In selected embodiments, Ni is preferred. This Schottky metal is surmounted by several thousand Angstrom units of Au to provide lower resistance, but other metals, semi-metals, semiconductors and combinations thereof can also be used to form the gate contact. In addition or in the alternative, additional gate conductor layers, such as polysilicon, may be deposited in the gate openings 61, patterned and etched to form the final gate electrode 62. In some configurations, Pt, Pd, Ir, Re, or other suitable barrier metal may be used as a diffusion barrier layer between the Ni, Pd, Ir, Re, Cu, or Pt Schottky metal and Au to prevent Au from mixing with the Schottky metal. As will be appreciated, the gate electrode 62 may be formed with any desired gate formation sequence, including but not limited to metal deposition and etching processes or a lift-off process wherein a gate metal (e.g., a metal comprising Ni and Au) is deposited on the mask 59 and in the gate electrode openings 61 so that, when the mask 59 is removed (e.g., by standard resist strip solvent), only the gate electrode 62, passivation layer 54, and contacts 58 remain.

Figure 11:
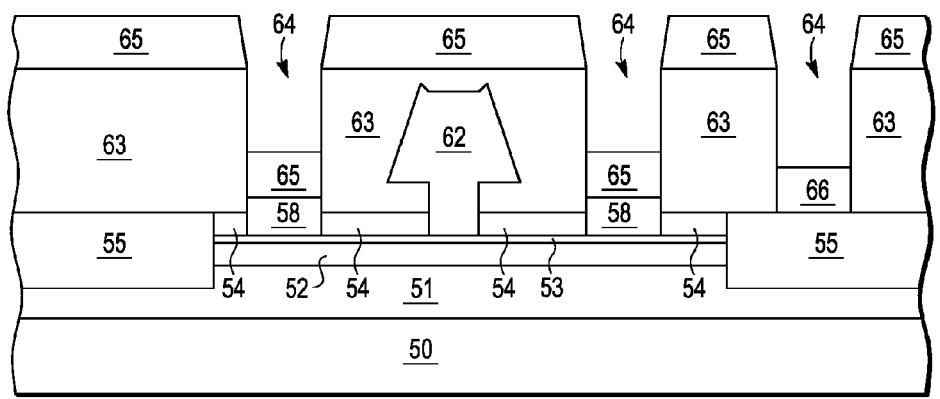
FIG. 11 illustrates processing of the semiconductor structure subsequent to FIG. 10 after one or more first metal layers are formed in openings of a patterned and etched third mask layer.

If desired, additional electrodes (such as source/drain electrodes or capacitor plates) can be formed separately. This is illustrated in FIG. 11 which depicts processing of the semiconductor structure subsequent to FIG. 10 after one or more first metal layers 65 are formed in openings 64 of a patterned mask layer 63. As a preliminary step, the multi-layer resist mask 59 is removed or stripped with an appropriate etch chemistry to leave the remnant passivation layer 54, gate electrode 62, and contacts 58. Subsequently, a patterned mask layer 63 may be formed by depositing and patterning a layer of photoresist with patterned openings 64 which expose the source/drain contact layers 58 while covering and protecting the gate electrode 62 and remnant passivation layer 54 in the active region area. The patterned openings 64 may also expose a capacitor plate area over an isolation region 55. At this stage, the first metal layers 65, 66 may be formed by depositing one or more "metal 1" layers on the patterned mask layer 63 and in the patterned openings 64 of the mask 63. In selected embodiments, the first metal layers 65, 66 may be formed with any desired metal formation sequence, including but not limited metal deposition and etching processes or a lift-off process wherein a metal is deposited on the mask 63 and in the patterned openings 64 so that, when the mask 63 is removed (e.g., by standard resist strip chemicals), only the gate electrode 62, passivation layer 54, contacts 58, and first metal layers 65, 66 remain. With the first metal layers, the "metal 1" layers may be used to form both the source/drain electrodes 65 and a MIM capacitor bottom plate 66.

Figure 12:
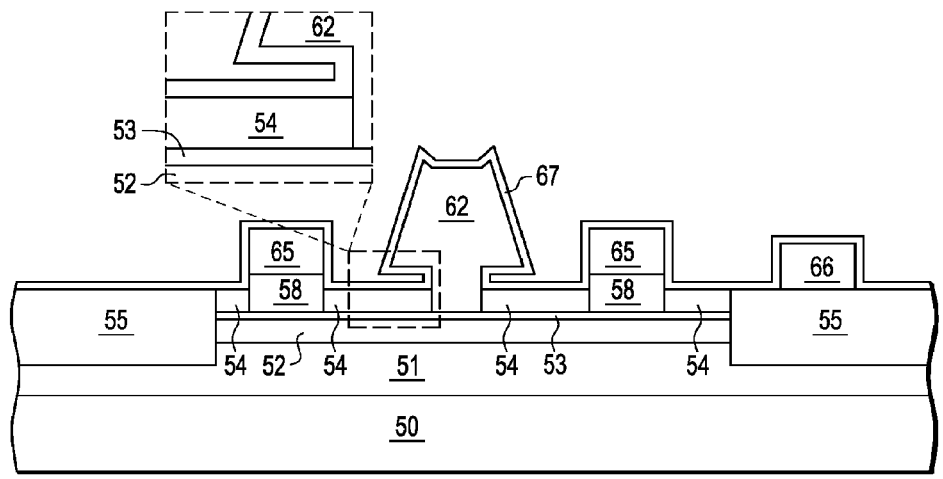
FIG. 12 illustrates processing of the semiconductor structure subsequent to FIG. 11 after a conformal dielectric layer is formed on exposed surfaces of the gate electrode and the first metal layers.

FIG. 12 illustrates processing of the semiconductor structure subsequent to FIG. 11 after one or more dielectric and/or passivation layers 67 are formed to cover the exposed sidewall surfaces of the gate electrode 62, source/drain electrodes 65, 68, and bottom capacitor plate 66. In an example implementation, one or more passivation layers 67 may be formed with any desired insulating or dielectric material (e.g., $Si_3N_4$, $SiO_2$, $SiO_xN_y$, AlN, $Al_2O_3$, and/or other suitable combinations or mixtures thereof) using any desired deposition technique (e.g., conformal CVD, PECVD, PVD, ALD, hot wire-CVD (HWCVD), catalytic CVD (CAT-CVD), electron-cyclotron resonance CVD (ECR-CVD), inductively coupled plasma CVD (ICP-CVD), evaporation, sputtering, etc.) to a predetermined thicknesses to cover the semiconductor structure. In selected embodiments, an initial passivation layer 67 is formed as an inter-layer dielectric (ILD) with a material having low hydrogen (e.g., <10%) and low ionic or electronic charge content. By forming the passivation layer(s) 67 with a highly conformal ALD layer of SiN or $Al_2O_3$, all exposed surfaces of the gate electrode 62 (including horizontal surfaces of the sidewall extension) and source/drain electrodes 58, 65 are coated. As shown in the enlarged image of the gate electrode sidewall extension, the conformal coating layer 67 forms minimal MIS sandwiches at each side of the gate electrode 62 to reduce leakage and ensure good high-voltage operation while allowing high $f_T$. Simultaneously, the passivation layer(s) 67 formed over the bottom plate 66 may be used as the capacitor dielectric for the MIM capacitor. Finally, it is noted that the disclosed fabrication sequence leaves the bottom or base of the gate electrode material 62 in direct physical contact with the remnant passivation layer 54. In cases where the gate electrode 62 is formed with nickel and the remnant passivation layer 54 is formed with SiN, this direct physical contact can result in adverse chemical reactions that can cause leakage.

As will be appreciated, the dielectric and/or passivation layer(s) 67 may be formed to encapsulate the exposed sidewall surfaces of the gate electrode 62 prior to formation of the first metal layers 65, 66 (shown in FIG. 11), provided that the contacts 58 are appropriately protected or cleared of any passivation layer(s) 67 prior to forming the first metal layers 65, 66. In this case, a second or additional passivation layer could be deposited after forming the first metal layers 65, 66, and then patterned and etched to during formation of the additional second metal layers 68-69 (described below).

To connect the semiconductor structure to other circuitry, additional interconnect layers may be formed to complete the gate, source, and drain electrodes using any desired metallization, masking and etching steps. In addition, the additional interconnect layers may be used to complete and connect the MIM capacitor. To illustrate how additional interconnect layers may be used to complete and connect the circuits, reference is now made to FIG. 13 which illustrates processing of the semiconductor structure subsequent to FIG. 12 after one or more additional second metal layers 68-69 are formed. As illustrated, the second metal layers 68 for the source/drain electrode are shown as being formed in direct ohmic contact with the first source/drain metal layers 65, while the second metal layers 69 for the top capacitor plate are separated from the first metal layers 66 for the bottom capacitor plate by the one or more dielectric and/or passivation layers 67. This may be accomplished by masking off the capacitor plate area when selectively etching the passivation layer(s) 67 to expose the first source/drain metal layers 65. Otherwise, the second metal layers 68, 69 may be formed with any desired metal formation sequence, including but not limited to contact and via formation in interlayer dielectric layers using damascene processes, lift-off processes, plasma etching, etc.

Figure 13:
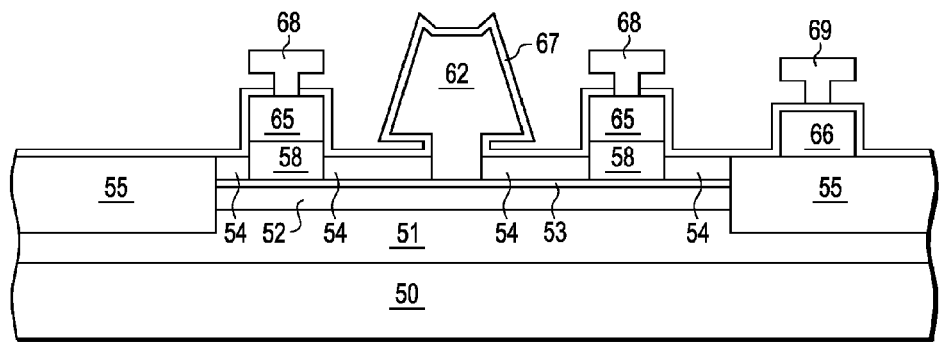
FIG. 13 illustrates processing of the semiconductor structure subsequent to FIG. 12 after one or more additional second metal layers are formed.
Figure 14:
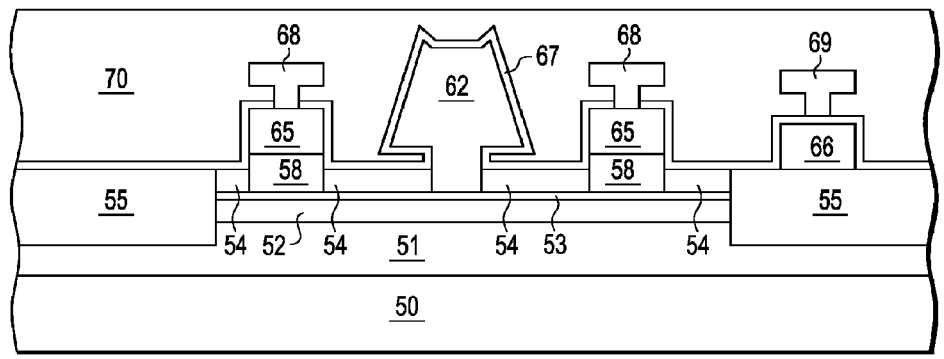
FIG. 14 illustrates processing of the semiconductor structure subsequent to FIG. 13 after one or more passivation layers are formed to cover the semiconductor structure.

FIG. 14 illustrates processing of the semiconductor structure subsequent to FIG. 13 after one or more dielectric and/or passivation layers are formed and planarized to cover the semiconductor structure. In an example implementation, one or more passivation layers 70 may be formed (e.g., conformal CVD, PECVD, PVD, ALD, HWCVD, CAT-CVD, ECR-CVD, ICP-CVD, evaporation, sputtering, etc.) to a predetermined thicknesses to cover the semiconductor structure. In selected embodiments, the passivation layer(s) 70 are with a material having low hydrogen and low ionic or electronic charge content. In addition, one or more protection layers (e.g., SiN) may also be formed as a passivation layer at the end of the front end processing. As will be appreciated, the passivation layer 70 may be formed (e.g., conformal CVD, PECVD, PVD, ALD, HWCVD, CAT-CVD, ECR-CVD, ICP-CVD, evaporation, sputtering, etc.) as a relatively thick, low stress and low charge layer or a polymide or benzocyclobutene (BCB) low-k dielectric layer. Subsequently or as part of forming the passivation layer(s) 70, a planarization process, such as chemical mechanical polishing (CMP) or the like, may be applied to substantially planarized the passivation layer(s) 70.

As indicated above, adverse reactions can be caused by forming the electrodes in direct physical contact with the substrate surface passivation layer. To prevent such direct physical contact, the substrate surface passivation layer may be removed from the sides of the electrode layers to form a gap which is filled with a non-reactive dielectric material, such as $Al_2O_3$. While a variety of different fabrication processes can be used to form and fill such gaps, reference is now made to FIGS. 15-23 which provide simplified cross-sectional views at different stages of manufacture which result in a field effect transistor device that is similar to the HFET device 4 shown in FIG. 4. In these figures, like reference numbers are used to identify like regions in the device.

Figure 15:
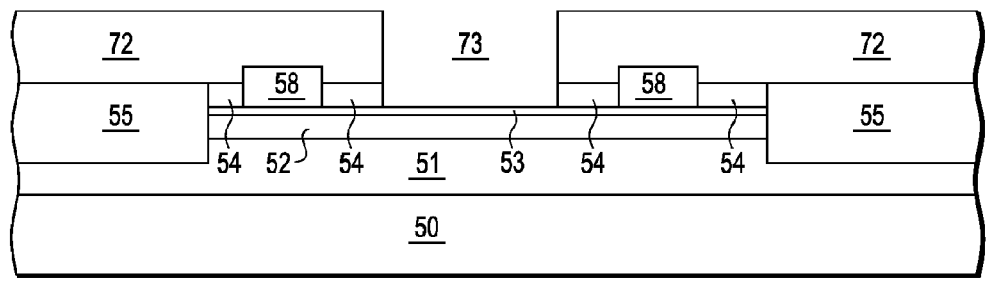
FIG. 15 illustrates processing of the semiconductor structure subsequent to FIG. 8 after an expanded gate electrode opening is etched in a second mask layer to remove portions of the passivation surface layer.

Referring now to FIG. 15, there is illustrated semiconductor structure after several preceding manufacturing stages have occurred, such as the manufacturing steps shown in FIGS. 1-8 whereby a substrate 50-53 is provided with an overlying passivation layer 54 in which source/drain contacts 58 have already been formed. In the processing of the semiconductor structure shown in FIG. 15, an expanded gate electrode opening 73 is etched in a patterned mask layer 72 to remove portions of the passivation surface layer 54 and expose the substrate structure. As a preliminary step, the etch mask 56 (from FIG. 8) is removed or stripped with an appropriate etch chemistry to leave the remnant passivation layer 54 and contacts 58. Subsequently, a patterned etch mask 72 is formed, such as by patterning an e-beam resist layer 72 (e.g., polymethylmethacrylate) with developers, (e.g., methy iso butyl ketone and tolune) to define an expanded gate electrode opening 73 and then the exposed dielectric in the opening 54 is etched with one or more etch processes. Depending on the number of type of layers formed in the etch mask 72, one or more etch processes may be applied (such as electron beam etching, reactive-ion etching, ion beam etching, plasma etching, ICP etching, ECR etching, laser etching, or the like) to form the expanded gate electrode opening 73 through the passivation surface layer 54. In selected embodiments, the expanded gate electrode opening 73 is formed by using a low power $SF_6$, reactive-ion etching (RIE) to etch a silicon nitride passivation surface layer 54. As will be appreciated, one or more gate dielectric layers may be exposed by the expanded gate electrode opening which were previously formed on the device mesas or isolated islands in the intended channel regions using any desired deposition sequence, though the gate dielectric layer(s) are not necessarily formed on the device mesas or isolated islands.

Figure 16:
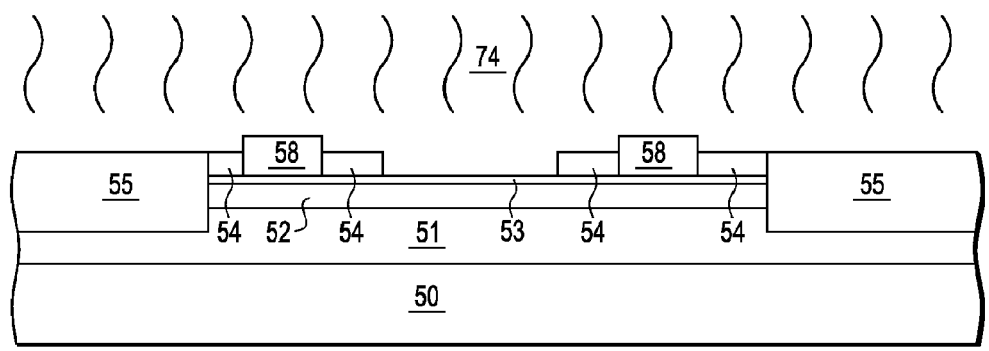
FIG. 16 illustrates processing of the semiconductor structure subsequent to FIG. 15 after the etch mask resist is stripped.

FIG. 16 illustrates processing of the semiconductor structure subsequent to FIG. 15 after the etch mask resist is stripped. As illustrated, the patterned etch mask 72 is removed or stripped with an appropriate etch chemistry to leave the remnant passivation layer 54 and contacts 58. Subsequently, a gate channel anneal step (e.g., at 400 C for 10 minutes in a nitrogen or oxygen environment) may be applied to reduce the effects of channel damage caused by etching of the passivation layer 54.

In the expanded gate electrode opening, a gate electrode is patterned and positioned so that the base of the gate electrode is separated from the dielectric passivation layer by a non-reactive dielectric material. To illustrate this sequence, reference is now made to FIG. 17 which illustrates processing of the semiconductor structure subsequent to FIG. 16 after a mushroom or T-gate electrode opening 76 is etched in a multi-layer resist mask 75 to expose the substrate structure. The patterned multi-layer resist mask 75 is formed by applying one or more etch processes to an e-beam resist layer substantially as described with reference to FIG. 9, and therefore the process details will not be repeated in detail. However, by positioning the mushroom or T-shaped opening 76 to be positioned wholly within the expanded gate electrode opening, there is a gap 77 formed between the remnant passivation layer 54 and the base of the opening 76. By controlling the width of the expanded gate electrode opening 73 and the relatively narrower width of the base or stem portion of the T-shaped opening 76, the gap 77 is provided which as a predetermined minimum width (e.g., approximately 200-1000 Å) which is sufficient to be completely filled by the subsequently formed dielectric passivation layer by a non-reactive dielectric material.

Figure 17:
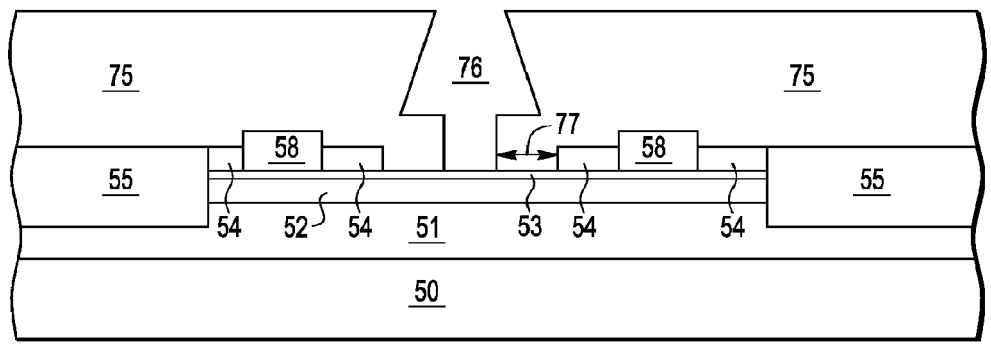
FIG. 17 illustrates processing of the semiconductor structure subsequent to FIG. 16 after a gate electrode opening is etched in a first patterned resist layer that is wholly contained within the expanded gate electrode opening.

While FIGS. 15-17 depict an example fabrication sequence for spacing the base or stem of the gate 76 from the silicon nitride passivation layer 54 by etching a large opening in the passivation layer 54 and then re-aligning the gate etch with a smaller footprint, other techniques may be used. For example, after forming a gate electrode opening 61 (such as shown in FIG. 9), an isotropic etch may be formed to laterally etch the silicon nitride passivation layer 54, thereby creating the gap 77 (not pictured).

Figure 18:
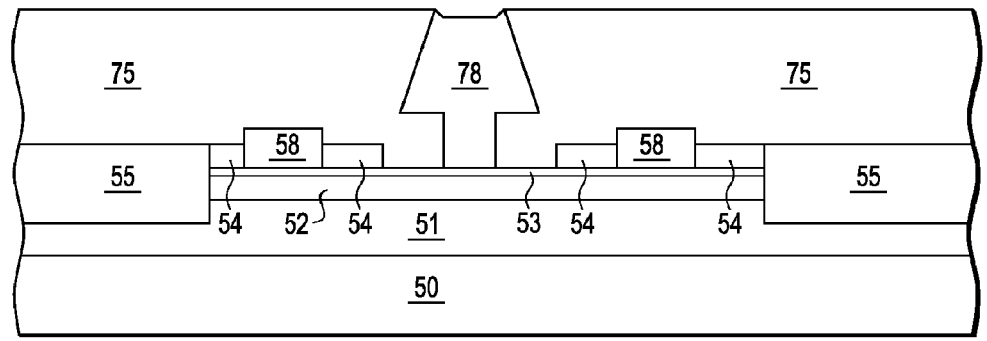
FIG. 18 illustrates processing of the semiconductor structure subsequent to FIG. 17 after a gate electrode is formed in the gate electrode opening.

FIG. 18 illustrates processing of the semiconductor structure subsequent to FIG. 17 after the gate electrode 78 is formed in the gate electrode opening 76. The patterned gate electrode 78 may be formed using any desired gate metal deposition process, including but not limited to a lift-off process and other examples described with reference to FIG. 10, and therefore the gate formation process details will not be repeated in detail.

Figure 19:
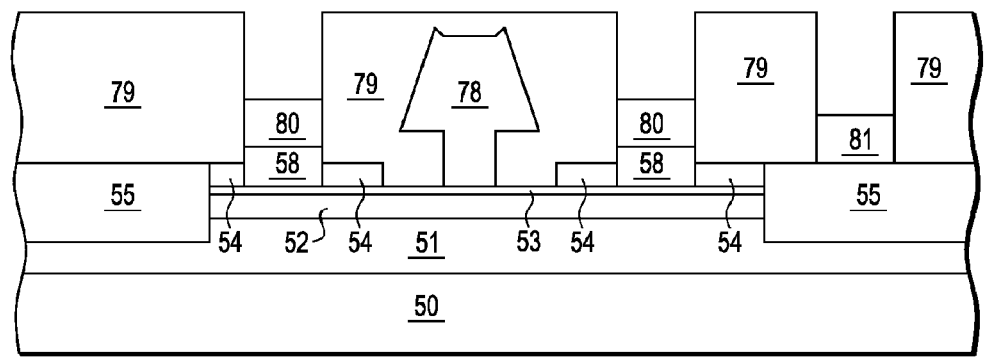
FIG. 19 illustrates processing of the semiconductor structure subsequent to FIG. 18 after one or more first metal layers are formed in openings of a second patterned resist layer.

After removing the multi-layer resist mask 75 to form the gate electrode 78, additional electrodes (such as source/drain electrodes or capacitor plates) can be formed separately. This is illustrated in FIG. 19 which depicts processing of the semiconductor structure subsequent to FIG. 18 after one or more first metal layers 80, 81 are formed in openings of a patterned mask layer 79. The first metal layers 80, 81 may be formed in the patterned mask layer 79 using one or more "metal 1" layers to form the source/drain electrodes 80 and a MIM capacitor bottom plate 81 substantially as described with reference to FIG. 11, and therefore the process details will not be repeated in detail.

Figure 20:
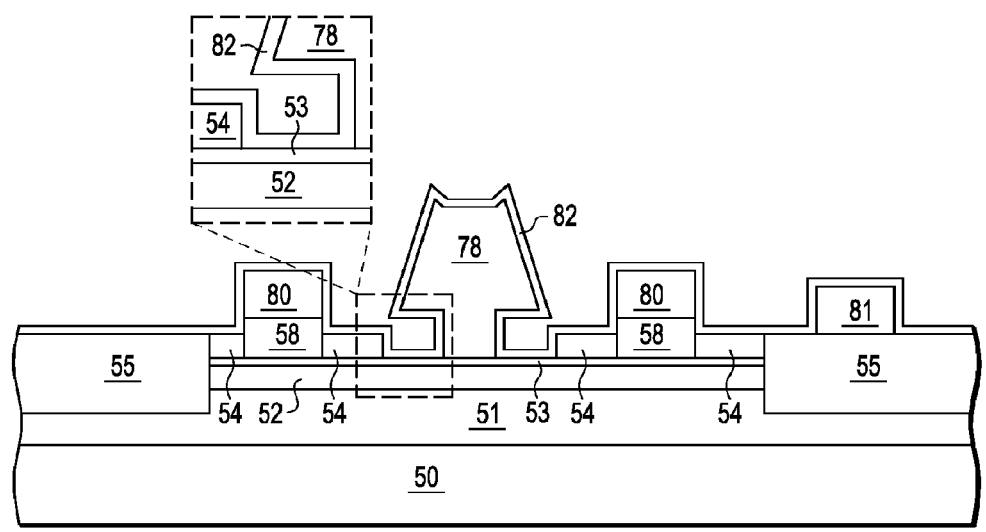
FIG. 20 illustrates processing of the semiconductor structure subsequent to FIG. 19 after one or more passivation layers are formed to cover the semiconductor structure.

FIG. 20 illustrates processing of the semiconductor structure subsequent to FIG. 19 after a first passivation layer 82 is formed to cover the exposed sidewall surfaces of the gate electrode 78, source/drain electrodes 58, 80, and bottom capacitor plate 81. In an example implementation, the first passivation layer 82 may be formed as a conformal layer of $Al_2O_3$, though any desired insulating or dielectric material (e.g., $Si_3N_4$, $SiO_2$, $SiO_xN_y$, AlN, and/or other suitable combinations or mixtures thereof) may be used with any desired deposition (e.g., conformal CVD, PECVD, PVD, ALD, HWCVD, CAT-CVD, ECR-CVD, ICP-CVD, evaporation, sputtering, etc.) to a predetermined thicknesses to cover the semiconductor structure. By forming the passivation layer(s) 82 with a highly conformal ALD layer of $Al_2O_3$ having a thickness of approximately 300 Å, all exposed surfaces of the gate electrode 78 and source/drain electrodes 58, 80 are coated, including specifically the horizontal surfaces of the sidewall extensions as well as the bottom or base of the gate electrode 78. As shown in the enlarged image of the gate electrode sidewall extension, the conformal coating layer 82 forms minimal MIS sandwiches at each side of the gate electrode 78 and also fills in the gap 77 formed between the remnant passivation layer 54 and the base of the gate electrode 78. Simultaneously, the first passivation layer 82 formed over the bottom plate 81 may be used as the capacitor dielectric for the MIM capacitor. While shown as a conformal layer having uniform thickness, it will be appreciated that the first passivation layer 82 generally covers at least the exposed vertical edges of the electrode base or bottom portion to form a vertical metal-insulator-semiconductor (MIS) sandwich that reduces leakage and ensures high-voltage operation.

Figure 21:
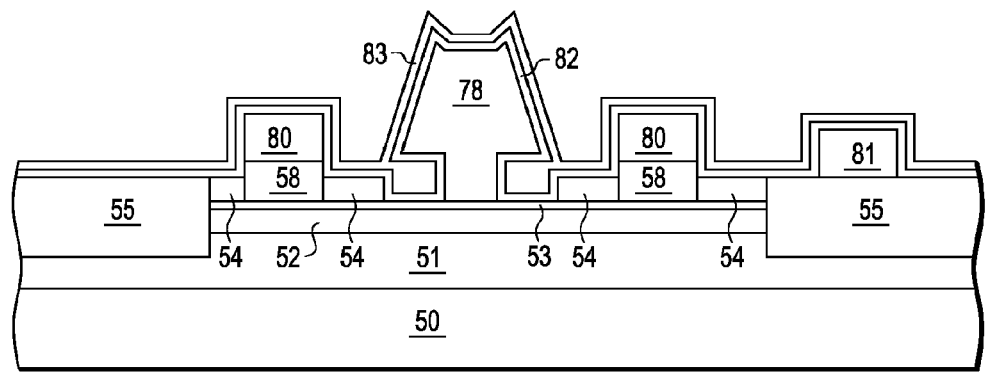
FIG. 21 illustrates processing of the semiconductor structure subsequent to FIG. 20 after one or more additional passivation layers are formed to cover the semiconductor structure.

FIG. 21 illustrates processing of the semiconductor structure subsequent to FIG. 20 after a second passivation layer 83 is formed to cover the first passivation layer 82. Though not shown, the second passivation layer may also be formed to cover the first passivation layer 67 (as shown in FIG. 12). In an example implementation, the second passivation layer 83 may be formed by sputtering a layer of SiN to a predetermined thickness (e.g., approximately 300 Å), though any desired insulating or dielectric material may be used with any desired deposition technique (e.g., conformal CVD, PECVD, PVD, ALD, evaporation, etc.) to any desired thicknesses to cover the semiconductor structure. By forming the second passivation layer 83 with sputtered SiN which does not have good sidewall coverage and is probably thinner under the gate electrode sidewall extensions, the second passivation layer 83 helps reduce the gate capacitance without coming into direct physical contact with the SiN passivation layer 54 because of the underlying first passivation layer 82. While the second passivation layer 83 is shown as filling the gap below the gate electrode sidewall extensions, it will be appreciated that the second passivation layer 83 may be formed as a layer that covers the first passivation layer 82.

Figure 22:
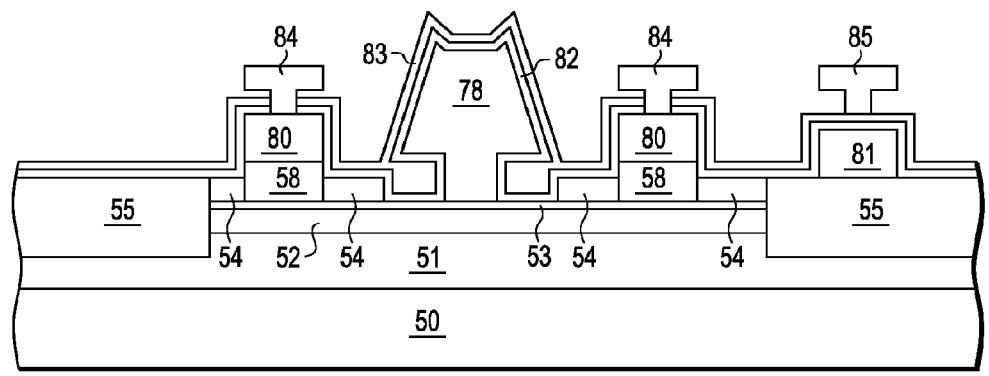
FIG. 22 illustrates processing of the semiconductor structure subsequent to FIG. 21 after one or more additional second metal layers are formed on the first metal layers.
Figure 23:
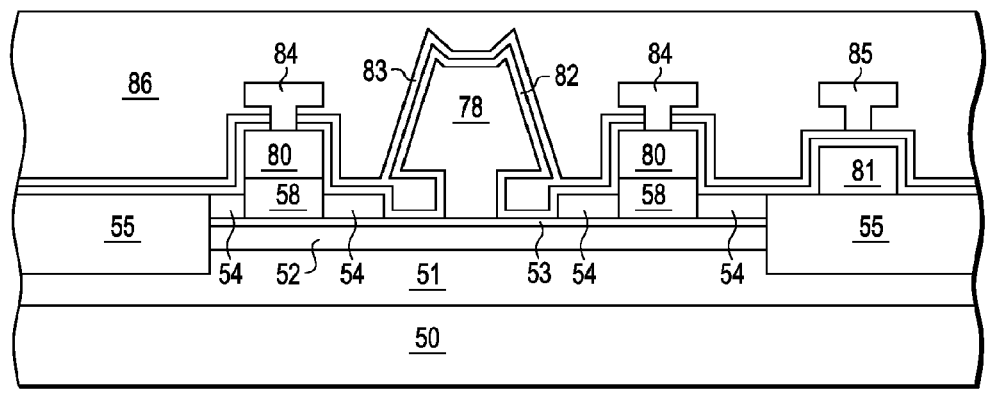
FIG. 23 illustrates processing of the semiconductor structure subsequent to FIG. 22 after one or more passivation layers are formed to cover the semiconductor structure.

To connect and complete the semiconductor structure circuitry, additional interconnect layers may be formed using any desired metallization, masking and etching steps. For example, FIG. 22 illustrates processing of the semiconductor structure subsequent to FIG. 21 after one or more additional second metal layers are formed to define source/drain electrodes 84 and the top capacitor plate 85. The second metal layers 84, 85 may be formed substantially as described with reference to FIG. 13, and therefore the process details will not be repeated in detail. In addition, one or more dielectric and/or passivation layers may be formed to cover the semiconductor structure as shown in FIG. 23 wherein one or more passivation layers 86 are formed (e.g., conformal CVD, PECVD, PVD, ALD, HWCVD, CAT-CVD, ECR-CVD, ICP-CVD, evaporation, sputtering, etc.) to a predetermined thicknesses to cover the semiconductor structure.

As shown with the example fabrication sequence depicted in FIGS. 15-23, a field effect transistor device may be formed with a gap that separates the metallic gate electrode from the silicon nitride surface passivation layer by first forming an expanded gate electrode opening. As will be appreciated, similar techniques can be used to separate the silicon nitride surface passivation layer from the sides of the ohmic metal stack with a gap that is filled with a non-reactive dielectric layer (e.g., ALD $Al_2O_3$). In general terms, this is accomplished by selectively removing portions of the silicon nitride surface passivation layer to create an expanded ohmic contact opening, and then subsequently forming an ohmic metal layer than is smaller than the expanded ohmic contact opening. While any desired fabrication sequence can be used to form the smaller ohmic metal layer, one approach may use two separate photolithography steps, where a first photoresist etch mask is used to etch the silicon nitride surface passivation layer with a relatively larger critical dimension (CD), and a second resist mask with a smaller CD is aligned and positioned to deposit the ohmic metal layer wholly within the expanded ohmic contact opening, such as by using a lift-off process. In another approach, a single photolithography step is used wherein an resist mask is aligned and positioned with patterned openings to deposit the ohmic metal layer only after application of an isotropic etch process which laterally removes part of the silicon nitride surface passivation layer under the resist mask, thereby leaving a gap or space between its sidewall and where the ohmic metal would be deposited. With the second approach, the ohmic metal would be deposited using a lift-off process. With either approach, the gap between the silicon nitride surface passivation layer and the ohmic metal layer is filled with a conformal non-reactive dielectric material, such as $Al_2O_3$, after the ohmic metal is deposited and annealed.

Figure 24:
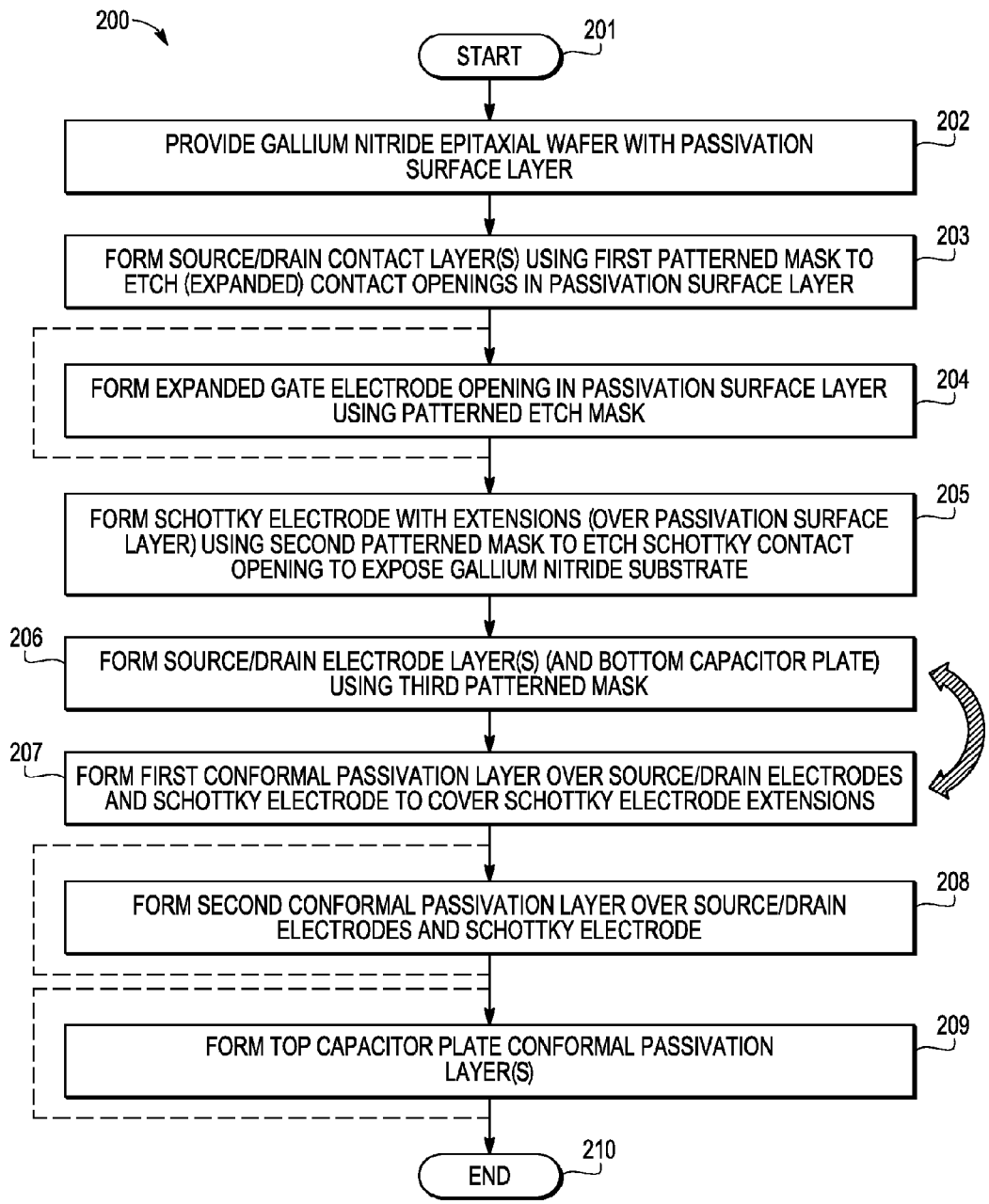
FIG. 24 is a simplified schematic flow chart illustrating various methods for fabricating devices in accordance with selected embodiments of the invention.

To further illustrated selected embodiments of the present invention, reference is now made to FIG. 24 which is a simplified schematic flow chart illustrating various methods for fabricating devices in accordance with selected embodiments of the invention. In describing the fabrication methodology 200, the description is intended merely to facilitate understanding of various exemplary embodiments and not by way of limitation. Unless otherwise indicated, subsequent steps may be provided in any desired order.

Once the fabrication methodology starts (step 201), a substrate layer is provided at step 202 which includes a gallium nitride epitaxial wafer layer that is covered by a passivation surface layer using means well known in the art. For example, the passivation surface layer may be formed by depositing a thin 5-30 nm layer of LPCVD SiN, though any desired insulating or dielectric material (e.g., $SiO_2$, $SiO_xN_y$, AlN, $Al_2O_3$) and deposition technique (e.g., conformal CVD, PECVD, PVD, ALD, HWCVD, CAT-CVD, ECR-CVD, ICP-CVD, evaporation, sputtering, etc.) could be used. In selected embodiments, the passivation surface layer is formed with a material that is selected to reduce leakage current in the finally formed device by properly preparing the surface of the underlying epi GaN substrate layer for deposition, and then depositing a silicon nitride film having a low hydrogen content (e.g., <10%) to prevent a leakage current path from forming at the passivation surface layer and substrate surface. On the substrate, alignment marks may be formed using a Ti—Pt or other suitable material to provide suitable electron diffraction for e-beam alignment. In addition, isolation regions are implanted using a photoresist implant mask which is subsequently stripped.

At step 203, a first patterned etch mask layer is formed to etch contact openings in the passivation surface layer in which source/drain contact layers are formed. For example, a patterned photoresist mask may be formed with etch contact openings which expose the passivation surface layer in the intended source/drain contact regions, followed by application of an anisotropic silicon nitride etch to remove the exposed regions of the passivation surface layer. Following the ohmic contact etch, ohmic metal is deposited and lifted off. The ohmic metal may then be annealed using a rapid thermal anneal heating step. In selected embodiments, the ohmic contacts may be formed by first applying a patterned etch mask layer to etch expanded contact openings in the passivation surface layer, and then subsequently forming a second patterned etch mask layer having contact openings exposing the substrate within the expanded contact openings in which source/drain contact layers are formed by depositing and lifting off a ohmic metal material.

At step 204, an expanded gate electrode opening may optionally be formed in the passivation surface layer using a patterned etch mask (as indicated by the dashed line bypassing step 204). For example, a patterned e-beam resist mask may be formed with etch contact openings which expose the passivation surface layer around the intended gate electrode region, followed by application of low power $SF_6$ reactive ion etch to remove the exposed regions of the passivation surface layer.

At step 205, a second patterned mask layer is formed to etch a Schottky contact opening down to the substrate in which the Schottky electrode is formed. As formed, the Schottky electrode includes lateral extensions or wings which may extend over the underlying passivation surface layer, depending on whether the expanded gate electrode opening removes the underlying passivation surface layer. For example, a multi-layered e-beam resist mask is selectively developed to form a mushroom or T-shaped opening having a base or stem which is then etched into the silicon nitride passivation surface layer. Subsequently, the Schottky electrode may be formed with a lift-off process wherein a gate metal (e.g., comprising Ni and Au) is deposited on the second patterned mask layer and in the Schottky contact opening so that, when the second patterned mask layer removed (e.g., by standard resist strip solvent), the Schottky electrode remains.

At step 206, a third patterned mask layer is formed with etch openings exposing the source/drain contact layers. In addition, a bottom capacitor plate opening may be formed. To this end, a patterned photoresist mask may be formed with etch openings which expose the source/drain contact layers and define a bottom capacitor plate area. Subsequently, the source/drain electrode layers and bottom capacitor plate may be formed with a lift-off process wherein a first metal layer is deposited on the third patterned mask layer and in the etch openings so that, when the third patterned mask layer removed (e.g., by standard resist strip solvent), the source/drain electrode and bottom capacitor plate layers remain.

At step 207, a first conformal passivation layer is formed over the source/drain electrodes and Schottky electrode so as to coat the exposed sidewall surfaces of the lateral extensions or wings. The first conformal passivation layer may be implemented with any desired non-reactive insulating or dielectric material (e.g., $Al_2O_3$) that is deposited (e.g., by conformal ALD) to a predetermined thicknesses (e.g., 100-500 Å). As formed, the first conformal passivation layer helps reduce gate leakage by covering the sidewall extensions with one or more conformal dielectric layers, thereby creating a minimal MIS sandwich at the gate electrode that reduces leakage and ensures good high-voltage operation.

At step 208, a second conformal passivation layer may optionally be formed on the first conformal passivation layer mask (as indicated by the dashed line bypassing step 208). The second conformal passivation layer may be implemented with any desired non-reactive insulating or dielectric material (e.g., SiN) that is deposited (e.g., by sputtering) to a predetermined thicknesses. As formed, the second conformal passivation layer helps reduce gate capacitance without adversely reacting with the Schottky metal due to the presence of the underlying first conformal passivation layer.

At step 209, a second metal layer is deposited after depositing the conformal passivation layer(s). The second metal layer may be used to form additional source/drain electrode layers as an optional top capacitor plate formed over the conformally passivation layer(s) (as indicated by the dashed line bypassing step 209). For example, a top capacitor plate may be formed along with additional source/drain electrode layers by selectively forming one or more additional metal layers. The transistor and MIM capacitor are now finished, though additional processing steps may be performed, including depositing a thick layer of BCB low-k dielectric material which can be capped with a layer of sputtered SiN if additional moisture protection is needed. At step 210, the process ends.

By now it should be appreciated that there is provided herein a high frequency, high voltage, low leakage current gallium nitride transistor and method for fabricating same. As disclosed, a substrate (e.g., a GaN/AlGaN/GaN substrate) is provided that has a gallium nitride layer covered by a passivation surface layer (e.g., $Si_3N_4$). Overlying the passivation surface layer, a mask is formed with a first mask opening. The mask may be formed as a multi-layer e-beam resist mask overlying the passivation surface layer. One or more etch processes are applied to the mask to expose a gate contact surface of the substrate under the first mask opening, such as by applying a low-power $SF_6$ reactive-ion etch to etch the mask to form a gate electrode opening with a relatively narrower contact base opening that exposes the gate contact surface of the substrate and a relatively wider gate electrode sidewall extension opening above the relatively narrower contact base opening, thereby exposing the gate contact surface of the substrate under the first mask opening. In selected embodiments, the relatively wider gate electrode sidewall extension opening is formed with sloped sidewalls formed in the multi-layer e-beam gate electrode resist mask so that the gate electrode sidewall extension opening has a wider bottom portion and a narrower top portion. In addition, a conductive gate electrode (e.g., Ni, Au, Pt, Pt—Au, Ni—Au, Ir, Ir—Au, Pd, Pd—Au, TiW, or TiWN) is formed, where the conductive gate electrode includes a contact base portion in contact with the gate contact surface of the substrate, and gate electrode sidewall extensions that are vertically spaced apart from the passivation surface layer by a vertical gap. In selected embodiment, the gate electrode is formed by first forming an mask overlying the substrate with a gate electrode mask opening positioned wholly within the first mask opening and adapted to define a gate electrode with sidewall extensions, followed by depositing a conductive gate electrode material in the gate electrode mask opening to form a conductive gate electrode in contact the gate contact surface of the substrate, where the gate electrode sidewall extensions are formed to be vertically spaced apart from the underlying passivation surface layer by a vertical gap, and where a base of the conductive gate electrode is laterally separated from the passivation surface layer by a lateral gap. On the gate electrode, one or more passivation layers are formed to cover exposed sidewall surfaces of the gate electrode wherein a portion of the one or more passivation layers is formed on a vertical sidewall of the contact base portion, thereby forming a metal-insulator-semiconductor sandwich below the gate electrode sidewall extensions. In selected embodiments, the passivation layers include a first passivation layer (e.g., conformal ALD $Al_2O_3$) formed in the gap with a dielectric material that is non-reactive with the conductive gate electrode, and also include a silicon nitride layer formed on the first passivation layer. In selected embodiments, a first plurality of patterned conductor layers may be formed prior to forming the one or more passivation layers to define source/drain electrode layers in electrical contact with the substrate and to define one or more bottom capacitor plate layers which are electrically isolated from the substrate. In addition, a second plurality of patterned conductor layers may be formed after forming the one or more passivation layers to define additional source/drain electrode layers in ohmic contact with the source/drain electrode layers and to define one or more top capacitor plate layers which are separated from the one or more bottom capacitor plate layers by the one or more passivation layers.

In another form, there is provided a high voltage gallium nitride field effect transistor device and associated method of fabricating same. In the disclosed methodology, a semiconductor having a gallium nitride surface layer is provided and processed to form a mesa that is defined by an upper portion of the semiconductor that is thicker than a lower portion of the semiconductor and that is covered by the gallium nitride surface layer. After covering the mesa with a passivation surface layer, such as by depositing a layer of $Si_3N_4$, $SiO_2$, $SiO_xN_y$, AlN, $Al_2O_3$, or $HfO_2$, a gate mask is provided that overlies the passivation surface layer with a first mask opening located above the mesa and having a first width. Using the gate mask, a portion of the passivation surface layer exposed by the first mask opening is etched to expose a first portion the gallium nitride surface layer, thereby defining passivation surface layer sidewalls and forming a first gate electrode opening over the gallium nitride surface layer. In the first gate electrode opening, a conductive gate electrode is formed in contact with at least part of the exposed first portion of the gallium nitride surface layer. As formed, the conductive gate electrode has a bottom gate length contact base having a gate length and upper gate electrode sidewall extensions formed to be vertically spaced apart from the underlying passivation surface layer by a minimum vertical gap distance $Y_{GATE}$. Subsequently, one or more passivation layers are formed on the conductive gate electrode to cover exposed sidewall surfaces of the conductive gate electrode. In selected embodiments, the gate mask is formed as a multi-layer e-beam resist mask over the passivation surface layer with a first mask opening having the first width so that the etching of the passivation surface layer forms a passivation surface layer opening having the first width to define passivation surface layer sidewalls adjacent to the first gate electrode opening. In this case, the conductive gate electrode has a gate length contact base in direct contact with the passivation surface layer sidewalls in the first gate electrode opening, and the one or more passivation layers are formed to cover exposed sidewall surfaces of the conductive gate electrode except where the gate length contact base is in direct contact with the passivation surface layer sidewalls. In other embodiments, the conductive gate electrode is formed by providing a second gate mask after etching through the portion of the passivation surface layer, where the second gate mask has a second narrower mask opening positioned wholly within the first mask opening to expose a second gate electrode opening over the gallium nitride surface layer that is positioned wholly within the first gate electrode opening. As a result, the passivation surface layer sidewalls are spaced apart from the second gate electrode opening. In this case, the conductive gate electrode is formed in contact with the exposed second gate electrode opening, and therefore has a gate length contact base that is laterally spaced apart from the passivation surface layer sidewalls. As a result, the passivation layer(s) formed on the conductive gate electrode cover exposed sidewall surfaces of the conductive gate electrode including the exposed gate length contact base that is laterally spaced apart from the passivation surface layer sidewalls.

In yet another form, there is provided a semiconductor device and associated method of manufacture. As disclosed, the semiconductor device includes a substrate having one or more active areas with a gallium nitride layer. In addition, a passivation surface layer covers the gallium nitride layer with a gate electrode opening formed therein to expose the gallium nitride surface layer and defined by passivation surface layer sidewalls separated by a first width. A conductive gate electrode is also formed at least in part in the gate electrode opening to be in contact with the gallium nitride surface layer, where the conductive gate electrode has a lower contact base having vertical sidewalls and upper gate electrode sidewall extensions formed to be vertically spaced apart from the passivation surface layer by a minimum vertical gap distance $Y_{GATE}$. On at least a portion of the vertical sidewalls of the contact base, one or more passivation layers are located. In embodiments where the width of the contact base (e.g., gate length) is narrower than the first width, the passivation layer(s) cover the entirety of the vertical sidewalls of the contact base. However, in embodiments where the width of the contact base (e.g., gate length) is equal to the first width, the passivation layer(s) cover the vertical sidewalls of the contact base except where the contact base is in direct contact with the passivation surface layer sidewalls. In selected embodiments, the thickness of the passivation layer(s) formed on the vertical sidewall surfaces of the contact base is controlled to prevent an increase in total gate capacitance by more than 10% as compared to a conductive gate electrode that does not have one or more passivation layers formed on the vertical sidewall surfaces of the contact base.

Although the described exemplary embodiments disclosed herein are directed to high-frequency, low leakage devices and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to switch devices formed on GaN-based materials and SiC substrates, this is merely for convenience of explanation and not intended to be limiting and persons of skill in the art will understand that the principles taught herein apply to devices formed with different substrate materials. Accordingly, the identification of particular regions being formed with one type of material or another is merely by way of illustration and not limitation and other materials may be substituted in order to form devices. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
    a substrate comprising one or more active areas with a gallium nitride layer;
    a passivation surface layer covering the gallium nitride layer with a gate electrode opening defined by passivation surface layer sidewalls separated by a first width;
    a conductive gate electrode located at least in part in the gate electrode opening to be in contact with the gallium nitride layer, where the conductive gate electrode comprises a lower contact base having vertical sidewalls and upper gate electrode sidewall extensions formed to be vertically spaced apart from the passivation surface layer by a minimum vertical gap distance;
    a first patterned metal layer defining one or more bottom capacitor plate layers which are electrically isolated from the substrate;
    one or more passivation layers located on at least a portion of the vertical sidewalls of the contact base and on a top surface of the one or more bottom capacitor plate layers; and
    a second patterned metal layer defining one or more top capacitor plate layers which are separated from the one or more bottom capacitor plate layers by the one or more passivation layers.

2. The semiconductor device of claim 1, where the contact base has a width that is narrower than the first width such that the one or more passivation layers cover the entirety of the vertical sidewalls of the contact base.

3. The semiconductor device of claim 1, where contact base has a width that is equal to the first width such that the one or more passivation layers cover vertical sidewalls of the contact base except where the contact base is in direct contact with the passivation surface layer sidewalls.

4. The semiconductor device of claim 1, where the one or more passivation layers located on the vertical sidewalls of the contact base have a total thickness that is controlled to prevent an increase in total gate capacitance by more than 10% as compared to a conductive gate electrode that does not have one or more passivation layers located on the vertical sidewalls of the contact base.

5. A gallium nitride transistor device, comprising:
    a substrate comprising an epitaxial gallium nitride surface layer;
    a passivation surface layer covering the epitaxial gallium nitride surface layer except for a gate contact opening and source/drain contact openings;
    a conductive gate electrode comprising:
        a contact base portion formed over the epitaxial gallium nitride surface layer in the gate contact opening, and
        gate electrode sidewall extensions that overlap with the passivation surface layer and are vertically spaced above the passivation surface layer by a vertical gap;
    a first plurality of patterned conductor layers defining (1) source/drain electrode layers in electrical contact with the epitaxial gallium nitride surface layer through the source/drain contact openings and (2) one or more bottom capacitor plate layers which are electrically isolated from the substrate;
    a passivation layer covering exposed sidewall surfaces of the conductive gate electrode and a top surface of the one or more bottom capacitor plate layers, wherein a portion of the passivation layer is formed on a vertical sidewall of the contact base portion located below the gate electrode sidewall extensions; and a second plurality of patterned conductor layers defining (1) additional source/drain electrode layers in ohmic contact with the source/drain electrode layers and (2) one or more top capacitor plate layers which are separated from the one or more bottom capacitor plate layers by the passivation layer.

6. The gallium nitride transistor device of claim 5, where the substrate comprises an upper gallium nitride cap layer, a middle aluminum gallium nitride barrier layer, and an underlying gallium nitride buffer layer.

7. The gallium nitride transistor device of claim 5, where the passivation surface layer comprises a layer of low-pressure chemical vapor deposition silicon nitride having a thickness of about 50-150 Å.

8. The gallium nitride transistor device of claim 5, where the conductive gate electrode comprises a Schottky gate electrode comprising nickel.

9. The gallium nitride transistor device of claim 5, where the passivation layer comprises a low hydrogen content and low ionic or electronic charge content passivation layer having a thickness of approximately 300 Å.

10. The gallium nitride transistor device of claim 5, where the gate electrode sidewall extensions are vertically spaced apart from the passivation surface layer by a vertical gap and where the contact base portion of the conductive gate electrode is laterally separated from the passivation surface layer by a lateral gap.

11. The gallium nitride transistor device of claim 5, where the contact base portion of the conductive gate electrode comprises a bottom diffusion barrier metal layer and an upper Schottky metal layer.

12. The gallium nitride transistor device of claim 10, where the passivation layer is located in the lateral gap.

13. The gallium nitride transistor device of claim 5, where the one or more bottom capacitor plate layers are located over an isolation region formed in the substrate.

14. The gallium nitride transistor device of claim 5, further comprising one or more conformal dielectric layers formed on the passivation layer covering exposed sidewall surfaces of the conductive gate electrode to form a vertical metal-insulator-semiconductor (MIS) sandwich along the vertical edges of the contact base portion of the conductive gate electrode to reduce leakage and ensure high-voltage operation.

15. The gallium nitride transistor device of claim 5, where each of the one or more top capacitor plate layers which are separated from the one or more bottom capacitor plate layers by the passivation layer comprise a Metal-Insulator-Metal capacitor.

16. A integrated circuit device, comprising:

a semiconductor layer comprising an elevated mesa section comprising a gallium nitride surface layer;

a passivation surface layer covering the covering the elevated mesa section, where the passivation surface layer comprises a gate contact opening and source/drain contact openings defined to expose the gallium nitride surface layer;

a conductive gate electrode positioned within the gate contact opening, where the conductive gate electrode comprises a gate length contact base having a gate length and gate electrode sidewall extensions formed to be vertically spaced apart from the passivation surface layer by a minimum vertical gap distance $Y_{GATE}$;

a first plurality of patterned conductor layers defining (1) source/drain electrode layers in electrical contact with the gallium nitride surface layer and (2) one or more bottom capacitor plate layers which are electrically isolated from the semiconductor layer;

one or more passivation layers covering exposed sidewall surfaces of the conductive gate electrode and the one or more bottom capacitor plate layers; and a second plurality of patterned conductor layers defining (1) additional source/drain electrode layers in ohmic contact with the source/drain electrode layers and (2) one or more top capacitor plate layers which are separated from the one or more bottom capacitor plate layers by the one or more passivation layers.

17. The integrated circuit device of 16, where the gate length contact base is in direct contact with the passivation surface layer in the gate contact opening.

18. The integrated circuit device of 17, where the one or more passivation layers on the conductive gate electrode cover exposed sidewall surfaces of the conductive gate electrode except where the gate length contact base is in direct contact with the passivation surface layer.

19. The integrated circuit device of 16, where the gate length contact base is laterally spaced apart from the passivation surface layer in the gate contact opening.

20. The integrated circuit device of 19, where the one or more passivation layers on the conductive gate electrode cover exposed sidewall surfaces of the conductive gate electrode including the exposed gate length contact base that is laterally spaced apart from the passivation surface layer.

* * * * *